United States Patent [19]
Jansson

[11] Patent Number: 5,684,480
[45] Date of Patent: Nov. 4, 1997

[54] WIDE DYNAMIC RANGE ANALOG TO DIGITAL CONVERSION

[75] Inventor: Fredrik Klas Jansson, Sundbyberg, Sweden

[73] Assignee: Telefonaktiebolaget LM Ericsson, Stockholm, Sweden

[21] Appl. No.: 380,719

[22] Filed: Jan. 30, 1995

[51] Int. Cl.$^6$ .................................................. H03M 1/18
[52] U.S. Cl. ........................................... 341/139; 341/155
[58] Field of Search .................................. 341/139, 155

[56] References Cited

U.S. PATENT DOCUMENTS

| | | | |
|---|---|---|---|
| 2,967,292 | 1/1961 | Eisner. | |
| 3,411,153 | 11/1968 | Steele | 341/139 |
| 3,815,124 | 6/1974 | Brewer | 341/160 |
| 4,016,557 | 4/1977 | Zitelli et al. | 341/139 |
| 4,168,470 | 9/1979 | Covitt | 341/126 |
| 4,584,560 | 4/1986 | McDaniel et al. | 341/139 |
| 4,851,842 | 7/1989 | Iwamatsu | 341/139 |
| 4,987,417 | 1/1991 | Buckland | 341/159 |
| 4,990,913 | 2/1991 | Beauducel | 341/139 |
| 4,999,628 | 3/1991 | Kakubo et al. | 341/139 |
| 5,055,845 | 10/1991 | Ridkosil | 341/155 |
| 5,194,865 | 3/1993 | Mason et al. | 341/132 |
| 5,343,200 | 8/1994 | Matsui | 341/139 |
| 5,422,643 | 6/1995 | Chu et al. | 341/141 |

FOREIGN PATENT DOCUMENTS 0 452 805  10/1991  European Pat. Off.

OTHER PUBLICATIONS

Patent Abstract of Japan. vol. 011, No. 220 (E-524), 16 Jul. 1987 & J,A,85 178974 (NEC), 19 Feb. 1987. (English Abstract and Drawing Sketch attached).

*Primary Examiner*—Marc S. Hoff
*Attorney, Agent, or Firm*—Burns, Doane, Swecker & Mathis, L.L.P.

[57] ABSTRACT

An analog-to-digital (A/D) converter circuit in which an extracted envelope of an input signal is used as a reference signal on an analog-to-digital converter, providing a wide dynamic range while avoiding the need for automatic gain control. Specifically, the A/D converter circuit includes a rectifier for rectifying an analog input signal, a filter for filtering a rectified analog signal output from the rectifier to provide a signal envelope used as the reference signal, and an analog-to-digital converter for converting the analog input signal into a digital signal within a range, the range being dynamically set in accordance with the reference signal provided by the filter. In alternative embodiments, an adder may be employed for adding the reference signal to the analog input signal as an offset and a multiplier for doubling the reference signal, the doubled reference signal being used for setting a range of the analog-to-digital converter, or a multiplier may be employed for generating a complement of the reference signal, wherein the reference signal and its complement are used for setting a range of the analog-to-digital converter. Still other alternatives include using a second analog-to-digital converter for converting the reference signal into a digital reference signal, using means for multiplying the digital reference signal with the digital signal output from the first analog-to-digital converter to scale the digital signal, and employing a digital-to-analog converter for converting the digital reference signal into a second analog reference signal, the second analog reference signal being used for setting a range of the first analog-to-digital converter.

19 Claims, 3 Drawing Sheets

WIDE DYNAMIC RANGE ANALOG TO DIGITAL CONVERSION

BACKGROUND OF THE INVENTION

1. Field of the Invention

The present invention relates to an analog-to-digital converter circuit in which an input signal acts as a reference signal on an analog-to-digital converter which adapts its range to the level of the input signal without a variable gain amplifier.

2. Discussion of Related Art

When an analog signal with a large dynamic range is to be converted into a digital signal, an analog-to-digital converter (ADC) with a high resolution has been conventionally required. Typically, the range in decibels (dB) divided by six (6) gives the necessary number of bits to be output by the ADC. In a radio receiver, for instance, where the level of the input signal could vary over a range of 100 dB, this formula would require an ADC to have 17 bits or more. In addition to the large dynamic range, a high conversion rate (greater than 100 kHz) could well be necessary, for example, due to a large bandwidth of the input signal.

To address these requirements, the most common solution to the dynamic range problem is to incorporate a function referred to as automatic gain control (AGC). In the typical AGC device such as shown in FIG. 1, an input signal $V_{in}$ is rectified by a rectifier 12 and filtered through a low-pass filter 13 to extract the envelope of the signal. This signal envelope is used as a control signal to control the gain of a variable gain amplifier 11. The amplifier 11 will have a low gain if the input signal, and thus the control signal, is large and a high gain if the control signal is low. The amplifier will provide an output signal with a compressed dynamic range after the amplifier. If the signal is then converted to a digital signal, an ADC 14 with a fixed reference voltage is used. The reference voltage sets the range of the ADC. To achieve a wide enough dynamic range with a conventional AGC, it might be necessary to connect several variable gain amplifiers in series. Another solution is offered in U.S. Pat. No. 4,990,913 issued to Beauducel on Feb. 5, 1991. The Beauducel patent discloses an ADC using a variable reference voltage. After amplification in a fixed gain amplifier, the input signals are applied to a sample and hold unit, the output of which is connected to a ADC. One of a number of possible reference voltages is selected for the ADC as a function of comparisons made between the sampled input and predetermined voltages.

Yet another solution is offered in U.S. Pat. No. 5,194,865 issued to Mason et al. on Mar. 16, 1993. The Mason et al. patent discloses an ADC having an automatic range control. The automatic range control is in the form of a peak detector which generates a reference potential corresponding to the peak amplitude of the input signal, a level shifting circuit for shifting the dc level of the input signal in accordance with the reference potential, and a ADC for convening the shifted input signal relative to the reference potential for high resolution digital output signals.

Other solutions include logarithmic ADC's and the NICAM (Near-Instantaneous Companding Audio Multiplex) system for television sound where blocks of samples are shifted with different shift factors for each block, the process being referred to as block floating point. However, the main purpose of these solutions is to lower the bit rate on the digital transmission following the ADC. These ADC's could be implemented as a high resolution ADC followed by some operation, for example, a ROM-table, to reduce the number of output bits. An inverse operation is then performed in the other end of the transmission chain. These solutions are not well suited if the goal is to simplify the ADC itself instead of decreasing the bit rate following the ADC.

SUMMARY OF THE INVENTION

The present invention provides a solution to the ADC dynamic range problem while avoiding the use of an automatic gain control. The invention involves rectifying an input signal and filtering the rectified input signal through a low-pass filter in the conventional manner to extract a signal envelope, but instead of including an amplifier with a variable gain, the signal envelope is used as a reference signal on the ADC.

Several embodiments are disclosed. For instance, the analog-to-digital converter circuit can further include an adder for adding the reference signal to the analog input signal as an offset and a multiplier for doubling the reference signal wherein the doubled reference signal sets the range of an analog-to-digital converter with two reference inputs.

Also, the analog-to-digital converter circuit may include a multiplier for generating a complement of the reference signal wherein the reference signal and its complement are used to set the range of an analog-to-digital converter with two reference inputs. Another embodiment enables absolute measurement of the output signal level.

Further, another embodiment is presented that keeps the gain in the signal path constant over a period of time by scaling the digital output signal with a digital reference signal, thus enabling processing which might have this feature as a requirement.

Yet another embodiment is presented which reduces the quantization error by converting the digital reference signal into an analog reference signal that is used to set the range of the wide range ADC.

BRIEF DESCRIPTION OF THE DRAWINGS

Further features of the invention, its nature and various advantages will be more apparent from the following detailed description of the invention and the accompanying drawings in which.

DETAILED DESCRIPTION OF THE PREFERRED EMBODIMENTS

Figure 2:
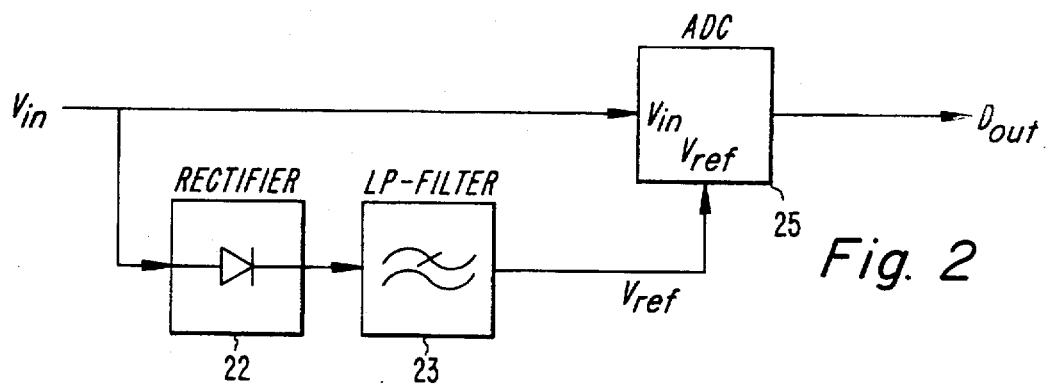
FIG. 2 is a schematic diagram of a first embodiment in accordance with the present invention.

FIG. 2 illustrates a first embodiment of the invention wherein an input signal $V_{in}$ is rectified by a rectifier 22 and filtered by a low-pass filter 23 to provide a reference voltage $V_{ref}$ representative of the signal envelope of the input signal $V_{in}$. The input signal $V_{in}$ is also input to an input port of the ADC 25 for conversion to a digital signal. Thus, the input signal $V_{in}$ is rectified and low-pass filtered as conventionally done in automatic gain control, but instead of having an amplifier with a variable gain, the signal envelope is used as a reference signal in the analog-to-digital conversion. The reference signal $V_{ref}$ sets the range of the ADC 25 and the ADC 25 will adapt its range to the level of the input signal $V_{in}$. An input sample with the same level as the reference input $V_{ref}$ will give the maximum output code from the ADC 25. In an 8-bit converter, the maximum output code would be 255 bits. This embodiment will solve the same problem as the inclusion of an automatic gain control but without the need of an amplifier with a variable gain.

One other advantage of the present invention is that it is easier to get it to work over a wider dynamic range compared to a variable gain amplifier because of the problem of making an amplifier with a gain that is variable over a wide range.

Most commercially available ADCs have two reference inputs, one corresponds to the input level which gives the maximum output code and one that corresponds to the input level which gives the minimum output code. One example of a commercially available ADC is the ADC0820 from National Semiconductor Corporation.

In the first embodiment only the maximum reference input is used for simplicity. However, for an ADC having two reference voltage inputs, the present invention can be implemented as shown in FIGS. 3 and 4.

Figure 3:
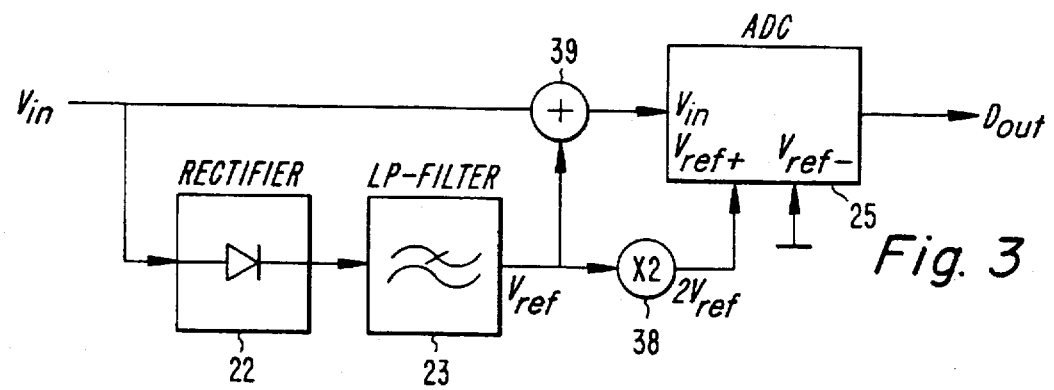
FIG. 3 is a schematic diagram of a second embodiment in accordance with the present invention.
Figure 4:
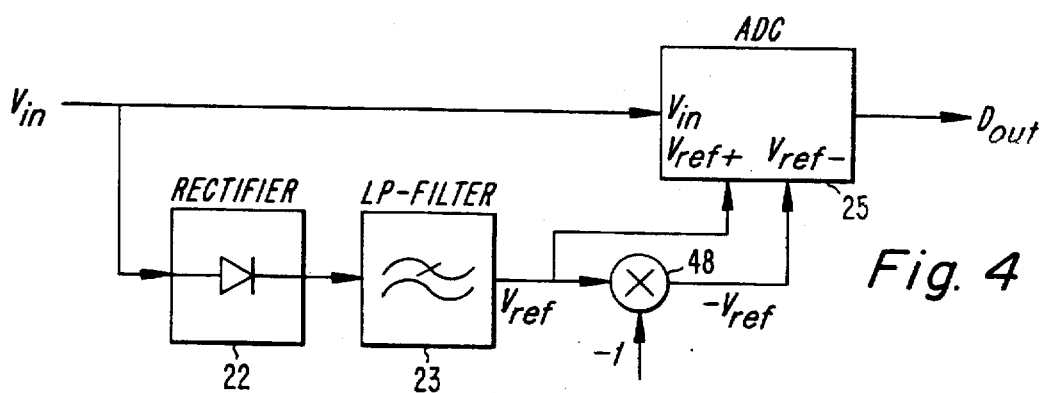
FIG. 4 is a schematic diagram of a third embodiment in accordance in the present invention.

A second embodiment is shown in FIG. 3 wherein the negative reference input of the ADC 25 is set to 0 V (ground), the positive input of the ADC 25 is set to two times the output of the low-pass filter 23 ($2 \times V_{ref}$) via a multiplier 38. An offset of $V_{ref}$ (the output of the low-pass filter 23) is added via an adder 39 to the input signal $V_{in}$. Thus, the full range is shifted up to the range of 0 V to a maximum value (i.e., $2 \times V_{ref}$), along with an upward offset of the input signal $V_{in}$.

Figure 3A:
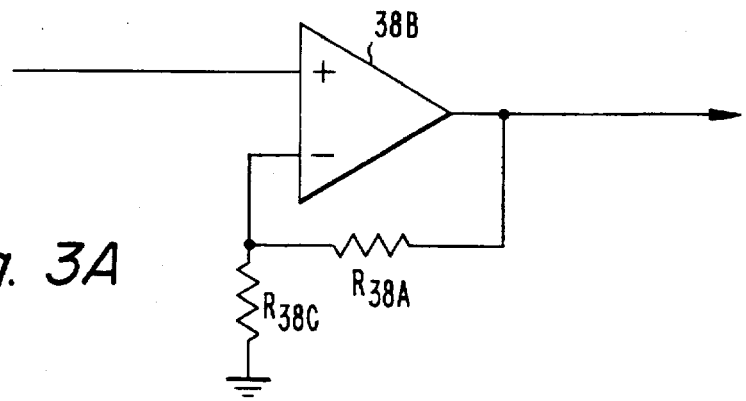
FIG. 3(a) is a schematic diagram of one type of multiplier suitable for use in the embodiment of FIG. 3.

FIG. 3(a) illustrates one way to implement the multiplier 38. Here, the multiplier 38 takes the form of an amplifier 38B the output of which is fed back through a resistor $R_{38A}$ to the negative input of the amplifier 38B. The node joining the negative input of the amplifier 38B and the resistor $R_{38A}$ is also connected to ground through another resistor $R_{38C}$. The input $V_{ref}$ to the amplifier 38B is thus subject to a gain of two when $R_{38A} = R_{38C}$. It must be emphasized that there are many ways to implement such a multiplier 38, FIG. 3(a) showing just one.

Figure 3B:
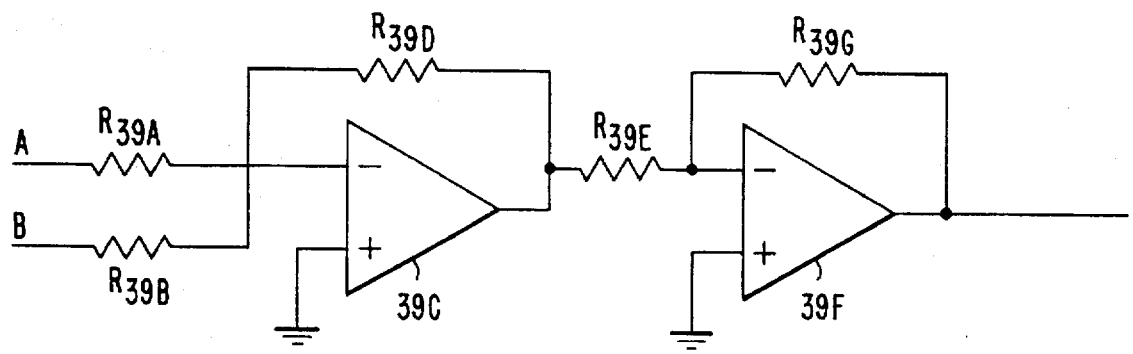
FIG. 3(b) is a schematic diagram of one type of summing amplifier suitable for use in the embodiment of FIG. 3.

FIG. 3(b) illustrates a summing amplifier 39 with a gain of one when all resistors indicated in FIG. 3 are of equal value suitable for use in the embodiment shown in FIG. 3. Any suitable summing amplifier maybe used, FIG. 3(b) showing just one by way of example. In this exemplary embodiment, the two inputs $V_{ref}$ and $V_{in}$ are input through resistors $R_{39A}$ and $R_{39B}$, respectively. The outputs of the resistors $R_{39A}$ and $R_{39B}$ are joined at a node with the feedback output signal of a first amplifier 39C, which has passed through a feedback resistor $R_{39D}$. The signal at this node is input to the negative input of the amplifier 39C. The positive input of the amplifier 39C is grounded. The output of the amplifier 39C is passed through another resistor $R_{39E}$ to be combined with a feedback signal at the negative input of a second amplifier 39F. The positive input of the amplifier 39F is grounded. The feedback signal passes through a feedback resistor $R_{39G}$. The configuration of this portion of the circuit is specific to a given application and the specific design to be implemented is within the skill level of any artisan.

A third embodiment is shown in FIG. 4, wherein the output of the low-pass filter serves both as a positive reference input and, after being converted to a complementary negative number (by multiplying by negative 1 via a multiplier 48) serves as a negative reference input.

Figure 4A:
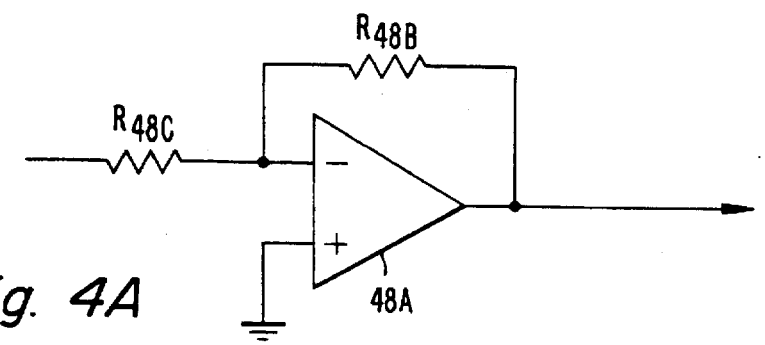
FIG. 4(a) is a schematic diagram of one type of multiplier suitable for use in the embodiment of FIG. 4.

FIG. 4(a) illustrates one way to implement the multiplier 48. Here, the multiplier 48 takes the form of an amplifier 48A the output of which is fed back through a resistor $R_{48B}$ to the negative input of the amplifier 48A. The node joining the negative input of the amplifier 48A and the resistor $R_{48B}$ is also connected to the input signal $V_{ref}$ which has passed through another resistor $R_{48C}$. The positive input of the amplifier 48A is grounded. By this circuit structure, the input $V_{ref}$ to the amplifier 48A is thus subject to a gain of negative one. As with FIG. 3(a), it must be emphasized that there are many ways to implement such a multiplier 48, FIG. 4(a) showing just one.

Although the circuits shown in FIGS. 2, 3 and 4 will solve the problem of accommodating an input signal having a wide dynamic range, some limitations could become apparent. A disadvantage of the circuits shown in FIGS. 2, 3 and 4 is that it does not make an absolute measurement of the signal level. One other disadvantage is that there could be signal processing following the ADC that assumes the gain in the signal path to be constant over a period of time.

Figure 1:
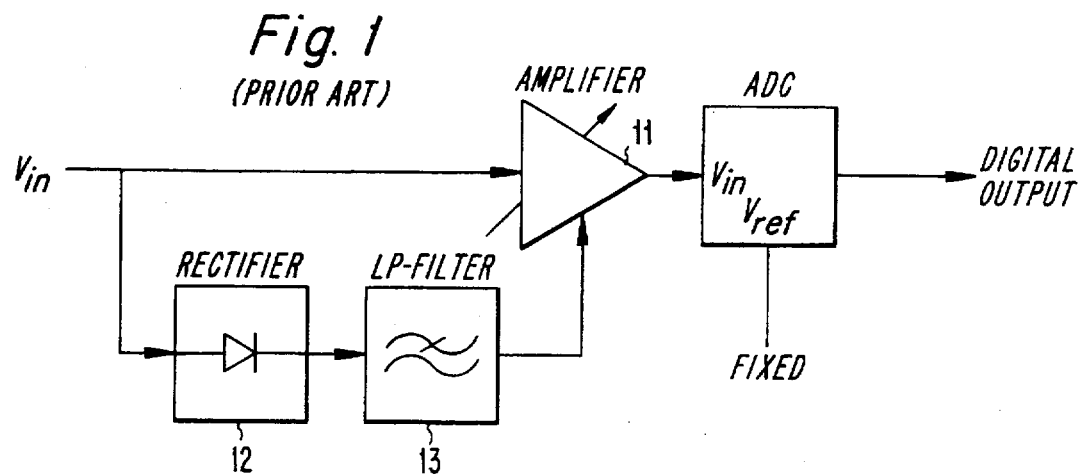
FIG. 1 is a schematic diagram of a conventional automatic gain controlled analog-to-digital converter.

It should be noted that there are cases where this is not a problem and where the circuit in FIG. 2 will work satisfactory. One example could be a simple FM-demodulator. It should also be noted that these disadvantages also exists in the prior art shown in FIG. 1.

Figure 5:
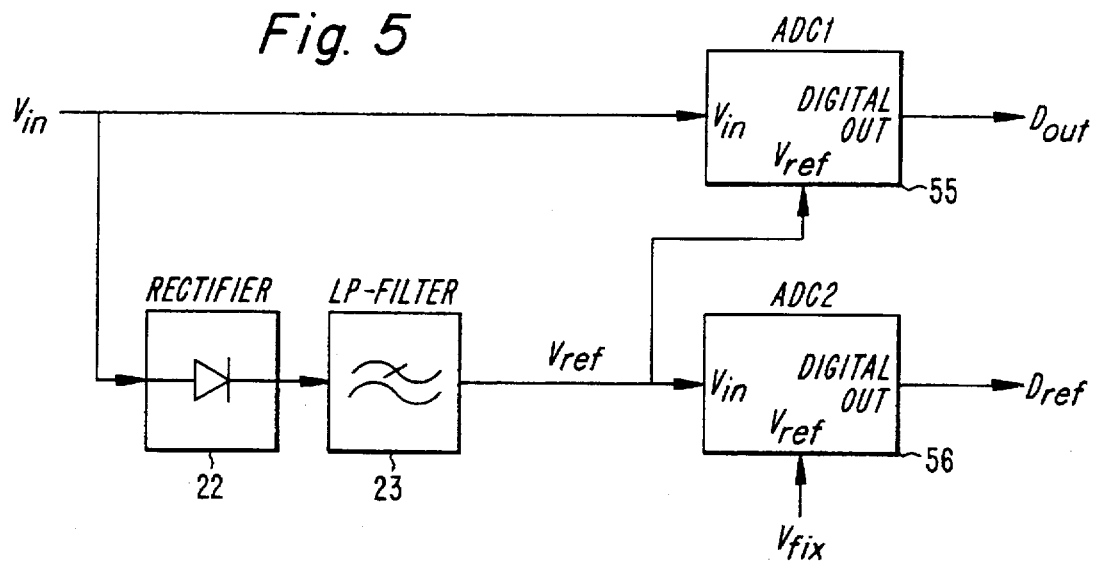
FIG. 5 is a schematic diagram of a fourth embodiment in accordance with the present invention.

FIG. 5 shows a fourth embodiment not subject to these disadvantages in that it provides an absolute level measurement. In addition to the first ADC 55, a second ADC 56 is included to measure the reference voltage $V_{ref}$ output from the low-pass filter 23. In accordance with the present invention, the time constant in the low pass filter 23 is typically long compared to the variations in the input signal. This means that the reference voltage $V_{ref}$ will vary much slower than the input signal $V_{in}$. Because of this, a slower ADC could be used as the second ADC 56, which would be simpler to implement and less expensive than the first ADC 55.

The second ADC 56 will have a fixed reference level $V_{fix}$. The output $V_{ref}$ from the LP-filter 23 is a signal that follows the envelope of the input signal $V_{in}$ and therefore the output $D_{ref}$ of the second ADC 56 could be used as an absolute measure of the input signal level. In some applications, it might be sufficient to be able to measure the absolute level at a lower rate than the sampling rate of the first ADC 55. For example, in a cellular phone system, absolute level measurements of signal strength are used as an input to handover algorithms.

Figure 6:
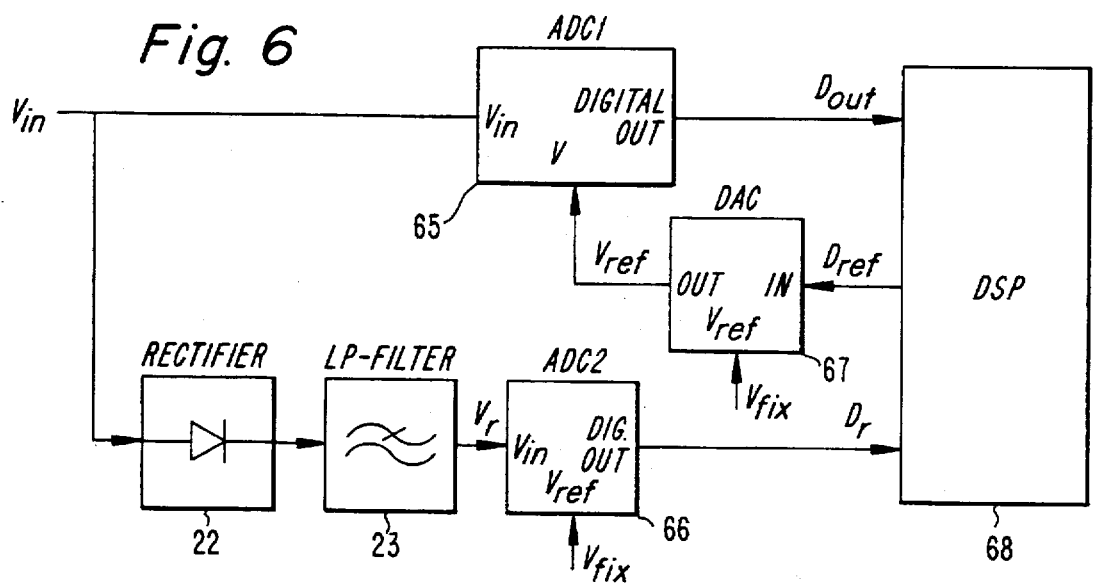
FIGS. 6 and 7 are schematic diagrams of a fifth embodiment in accordance with the present invention.

If, however, the problem with the varying gain affecting the subsequent signal processing should be solved, then each output sample $D_{out}$ would have to be scaled with the reference voltage $V_{ref}$. The embodiment shown in FIG. 6 provides this capability. Just as in the fourth embodiment shown in FIG. 5, an envelope signal $V_r$ from the low pass filter 23 is converted from analog to digital in a second ADC 66. Instead of using the analog signal $V_r$ as a reference voltage for the first ADC 65, the reference voltage $V_{ref}$ for the first ADC 65 is provided by a Digital Signal Processor (DSP) 68 through a Digital-to-Analog Converter (DAC) 67. The DSP 68, shown in FIG. 6, could be implemented as an Application Specific Integrated Circuit (ASIC). The advantage of providing the DAC 67 is explained below.

Figure 7:
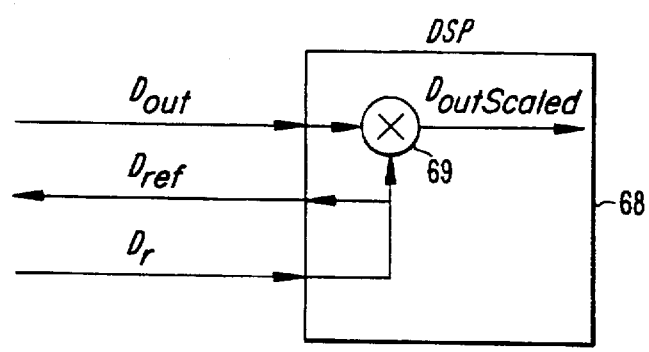

FIG. 7 shows one example of how output samples could be scaled. This solution has an advantage compared to the embodiment shown in FIG. 5. Specifically, the DSP 68 can include a multiplier 69, implemented in software, for scaling the digital output from of the first ADC 65. In the solution showed in FIG. 5 the output from the first ADC 55 is:

$$D_{out} = \frac{V_{in}}{V_r} 2^N + q_{err1}$$

where N is the number of bits in the first ADC 55 and the quantization error $$q_{err1} = trunc\left(\frac{V_{in}}{V_r} 2^N\right) - \frac{V_{in}}{V_r} 2^N$$

If the digital output $D_{out}$ of the first ADC 55 would be scaled with $D_{ref}$ (an output of ADC 56) in a way similar to the embodiment of FIG. 2 to make it independent of the reference level then:

$$D_{outScaled} = \left(\frac{V_{in}}{V_r} 2^N + q_{err1}\right) D_{ref}$$

where M is the number of bits in the second ADC 56 and $V_{fix}$ is its reference and $$D_{ref} = \frac{V_r}{V_{fix}} 2^M + q_{err2}$$

With the quantization error in $$ADC2\_q_{err2} = trunc\left(\frac{V_r}{V_{fix}} 2^M\right) - \frac{V_r}{V_{fix}} 2^M$$

then $D_{outScaled} = \left(\frac{V_{in}}{V_r} 2^N + q_{err1}\right)\left(\frac{V_r}{V_{fix}} 2^M + q_{err2}\right)$ $$D_{outScaled} = \frac{V_{in}}{V_{fix}} 2^{(N+M)} + \left(\frac{V_{in}}{V_r} 2^N\right) q_{err2} + q_{err1}\left(\frac{V_r}{V_{fix}} 2^M + q_{err2}\right)$$

Unfortunately the second term that depends on the quantization error from the second ADC 56, i.e. $q_{err2}$, could not be eliminated. If the circuit shown in FIGS. 6 and 7 is used instead, then $D_{outScaled}$ becomes:

$$D_{outScaled} = \left(\frac{V_{in}}{V_{ref}} 2^N + q_{err1}\right) D_{ref}$$

With $V_{ref} = D_{ref}\left(\frac{V_{fix}}{2^M}\right)$

Then $D_{outScaled} = \left(\frac{V_{in}}{D_{ref}\left(\frac{V_{fix}}{2^M}\right)} 2^N + q_{err1}\right) D_{ref}$ $$D_{outScaled} = \frac{V_{in}}{V_{fix}} 2^{(N+M)} + q_{err1} D_{ref}$$

With $D_{ref} = \frac{V_r}{V_{fix}} 2^M + q_{err2}; D_r \equiv D_{ref}$

Then $D_{outScaled} = \frac{V_{in}}{V_{fix}} 2^{(N+M)} + q_{err1}\left(\frac{V_r}{V_{fix}} 2^M + q_{err2}\right)$ This means that the second term that depended on the quantization error from the second ADC 66 could be eliminated in the scaled output $D_{outScaled}$. In other words, instead of using the unquantized voltage $V_r$ as a reference signal to the first ADC 65 and then scale $D_{out}$ with its quantized value $D_{ref}$ it is better to use the quantized voltage $V_{ref}$ which corresponds exactly to $D_{ref}$ without quantization error.

No extra error will then be introduced even if the extracted signal envelope $V_r$ varies in the time between each digital sample $D_r$. This could also be important if the sample rate of the second ADC 66 is lower than the sample rate of the first ADC 65. The output $D_{outScaled}$ is still scaled with exactly the same reference that is used to set the range of the first ADC 65. If the digital sample $D_r$ is going to be used as a measure of absolute signal strength, it would however have the quantization error $q_{err2}$.

In an implementation of the embodiment showed in FIGS. 6 and 7, the second ADC 66 could be of a type that includes a DAC, for example a successive approximation converter. In this case it would be possible to get the quantized voltage $V_{ref}$ directly from the second ADC 66. It should be noted that a converter implemented like the one in FIGS. 6 and 7 will have a dynamic range of N+M bits. The quantization error however will be like that of N bit converter. It should also be noted that, with a different algorithm in the DSP 68 shown in FIG. 7 and without a low pass filter, the results of the circuit described in Beauducel patent, could be emulated. In this case the sample rate of the two ADCs would have to be equal.

One skilled in the art will appreciate that the present invention can be practiced by other than the above-described embodiments which are presented for purposes of illustration and not of limitation. The scope of the invention should be measured by the claims appended hereto.

I claim:

1. An analog-to-digital converter circuit, comprising:
    a rectifier for rectifying an analog input signal;
    a filter operatively connected to said rectifier for filtering a rectified analog signal output from said rectifier to provide a signal envelope used as a reference signal; and
    a first analog-to-digital converter for converting said analog input signal into a digital signal within a range, said range being dynamically set in accordance with said reference signal provided by said filter.

2. An analog-to-digital converter circuit in accordance with claim 1, wherein said filter is a low-pass filter.

3. An analog-to-digital converter circuit, comprising:
    a rectifier for rectifying an analog input signal;
    a filter operatively connected to said rectifier for filtering a rectified analog signal output from said rectifier to provide a reference signal;
    a first analog-to-digital converter for converting said analog input signal into a digital signal within a range, said range being dynamically set in accordance with said reference signal provided by said filter; and
    an adder for adding said reference signal to said analog input signal as an offset and a multiplier for doubling said reference signal, said doubled reference signal being used for setting a range of said first analog-to-digital converter.

4. An analog-to-digital converter circuit, comprising:

a rectifier for rectifying an analog input signal;

a filter operatively connected to said rectifier for filtering a rectified analog signal output from said rectifier to provide a reference signal;

a first analog-to-digital converter for converting said analog input signal into a digital signal within a range, said range being dynamically set in accordance with said reference signal provided by said filter; and a multiplier for generating a complement of said reference signal, wherein said reference signal and said complement of said reference signal are used for setting a range of said first analog-to-digital converter.

5. An analog-to-digital converter circuit, comprising:

a rectifier for rectifying an analog input signal;

a filter operatively connected to said rectifier for filtering a rectified analog signal output from said rectifier to provide a reference signal;

a first analog-to-digital converter for converting said analog input signal into a digital signal within a range, said range being dynamically set in accordance with said reference signal provided by said filter; and a second analog-to-digital converter for converting said reference signal into a digital reference signal.

6. An analog-to-digital converter circuit in accordance with claim 5, further comprising:

means for multiplying said digital reference signal with said digital signal output from said first analog-to-digital converter to scale said digital signal.

7. An analog-to-digital converter circuit in accordance with claim 5, further comprising:

a digital-to-analog converter for converting said digital reference signal into a second analog reference signal, said second analog reference signal being used for setting a range of said first analog-to-digital converter.

8. An analog-to-digital converter circuit, comprising:

a full-wave rectifier for rectifying an analog input signal;

a filter operatively connected to said rectifier for filtering a rectified analog signal output from said rectifier to provide a reference signal; and a first analog-to-digital converter for converting said analog input signal into a digital signal within a range, said range being dynamically set in accordance with said reference signal provided by said filter.

9. An analog-to-digital converter circuit in accordance with claim 8, further comprising an adder for adding said reference signal to said analog input signal as an offset and a multiplier for doubling said reference signal, said doubled reference signal being used for setting a range of said first analog-to-digital converter.

10. An analog-to-digital converter circuit in accordance with claim 8, further comprising a multiplier for generating a complement of said reference signal, wherein said reference signal and said complement of said reference signal are used for setting a range of said first analog-to-digital converter.

11. An analog-to-digital converter circuit in accordance with claim 8, further comprising a second analog-to-digital converter for converting said reference signal into a digital reference signal.

12. An analog-to-digital converter circuit in accordance with claim 11, further comprising means for multiplying said digital reference signal with said digital signal output from said first analog-to-digital converter to scale said digital signal.

13. An analog-to-digital converter circuit in accordance with claim 12, further comprising a digital-to-analog converter for converting said digital reference signal into a second analog reference signal, said second analog reference signal being used for setting a range of said first analog-to-digital converter.

14. An analog-to-digital converter circuit, comprising:

a rectifier for rectifying an analog input signal;

a filter operatively connected to said rectifier for filtering a rectified analog signal output from said rectifier to provide a continuously variable reference signal; and a first analog-to-digital converter for converting said analog input signal into a digital signal within a continuous range, said continuous range being dynamically set in accordance with said reference signal provided by said filter.

15. An analog-to-digital converter circuit in accordance with claim 14, further comprising an adder for adding said reference signal to said analog input signal as an offset and a multiplier for doubling said reference signal, said doubled reference signal for setting a range of said first analog-to-digital converter.

16. An analog-to-digital converter circuit in accordance with claim 14, further comprising a multiplier for generating a complement of said reference signal, wherein said reference signal and said complement of said reference signal are used for setting a range of said first analog-to-digital converter.

17. An analog-to-digital converter circuit in accordance with claim 14, further comprising a second analog-to-digital converter for converting said reference signal into a digital reference signal.

18. An analog-to-digital converter circuit in accordance with claim 17, further comprising means for multiplying said digital reference signal with said digital signal output from said first analog-to-digital converter to scale said digital signal.

19. An analog-to-digital converter circuit in accordance with claim 18, further comprising a digital-to-analog converter for converting said digital reference signal into a second analog reference signal, said second analog reference signal being used for setting a range of said first analog-to-digital converter.

\* \* \* \* \*